(12) United States Patent
Heineck et al.

(10) Patent No.: US 9,385,132 B2
(45) Date of Patent: Jul. 5, 2016

(54) ARRAYS OF RECESSED ACCESS DEVICES, METHODS OF FORMING RECESSED ACCESS GATE CONSTRUCTIONS, AND METHODS OF FORMING ISOLATION GATE CONSTRUCTIONS IN THE FABRICATION OF RECESSED ACCESS DEVICES

(75) Inventors: Lars P. Heineck, Garden City, ID (US); Troy R. Sorensen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 13/217,963

(22) Filed: Aug. 25, 2011

(65) Prior Publication Data
US 2013/0049072 A1    Feb. 28, 2013

(51) Int. Cl.
| H01L 21/283 | (2006.01) |
| H01L 27/108 | (2006.01) |
| H01L 21/28 | (2006.01) |
| H01L 29/66 | (2006.01) |
| H01L 21/308 | (2006.01) |

(52) U.S. Cl.
CPC .... *H01L 27/10876* (2013.01); *H01L 21/28123* (2013.01); *H01L 21/3086* (2013.01); *H01L 29/66621* (2013.01)

(58) Field of Classification Search
CPC ............ H01L 21/8238; H01L 27/0922; H01L 27/11807; H01L 2027/11807; H01L 21/76897; H01L 21/8224; H01L 21/8228; H01L 21/8234; H01L 21/823885; H01L 29/0847; H01L 29/42316; H01L 29/42384; H01L 29/66
USPC ....... 257/E21.546, E21.548, E21.55, E27.09, 257/E27.095, E29.26, E21.553, 301, 304, 257/311, 577, 374, 401, 302, 255, 330, 334, 257/319, 211–212, 315, 202, 327, 296; 438/589, 334, 435, 591, 225, 262, 267, 438/269, 270, 230, 243–244, 248, 250, 259, 438/296
See application file for complete search history.

(56) References Cited

U.S. PATENT DOCUMENTS

| 5,328,810 | A | * | 7/1994 | Lowrey et al. ................. 430/313 |
| 5,814,547 | A | | 9/1998 | Chang |
| 7,189,628 | B1 | | 3/2007 | Mirbedini et al. |
| 7,214,625 | B2 | | 5/2007 | Asami et al. |
| 7,282,401 | B2 | | 10/2007 | Juengling |
| 7,411,268 | B2 | | 8/2008 | Karpov et al. |

(Continued)

FOREIGN PATENT DOCUMENTS

| JP | H06-069605 | 3/1994 |
| JP | 2001-0114592 | 4/2001 |

(Continued)

*Primary Examiner* — Selim Ahmed
*Assistant Examiner* — Moin Rahman
(74) *Attorney, Agent, or Firm* — Wells St. John, P.S.

(57) ABSTRACT

A method of forming an array of recessed access device gate constructions includes using the width of an anisotropically etched sidewall spacer in forming mask openings in an etch mask for forming all recessed access device trenches within semiconductor material within all of the array. The etch mask is used while etching all of the recessed access device trenches into the semiconductor material within all of the array through the mask openings. Individual recessed access gate constructions are formed in the individual recessed access device trenches. Other methods are contemplated, including arrays of recessed access devices independent of method of manufacture.

38 Claims, 4 Drawing Sheets

(56) References Cited

U.S. PATENT DOCUMENTS

| | | |
|---|---|---|
| 7,915,116 B2 | 3/2011 | Eppich |
| 8,039,340 B2 | 10/2011 | Davis et al. |
| 8,389,353 B2 | 3/2013 | Davis et al. |
| 8,440,515 B2 * | 5/2013 | Tang et al. ............ 438/197 |
| 8,525,201 B2 | 9/2013 | Lee et al. |
| 2002/0004290 A1 * | 1/2002 | Gruening et al. ......... 438/484 |
| 2004/0152288 A1 | 8/2004 | Trogolo et al. |
| 2006/0046407 A1 | 3/2006 | Juengling |
| 2007/0054464 A1 | 3/2007 | Zhang |
| 2007/0117314 A1 | 5/2007 | Ozawa |
| 2007/0141783 A1 * | 6/2007 | Peake ................... 438/259 |
| 2008/0113483 A1 | 5/2008 | Wells |
| 2008/0166856 A1 * | 7/2008 | Parekh et al. ............ 438/435 |
| 2008/0173920 A1 | 7/2008 | Juengling |
| 2008/0258206 A1 * | 10/2008 | Hofmann ................ 257/327 |
| 2008/0318032 A1 * | 12/2008 | Zhu et al. ............... 428/336 |
| 2009/0035665 A1 * | 2/2009 | Tran ....................... 430/5 |
| 2009/0080229 A1 | 3/2009 | Sekar et al. |
| 2009/0170318 A1 | 7/2009 | Choi |
| 2009/0206443 A1 | 8/2009 | Juengling |
| 2010/0098742 A1 | 4/2010 | Vacanti et al. |
| 2010/0144150 A1 * | 6/2010 | Sills et al. ................ 438/694 |
| 2010/0173470 A1 | 7/2010 | Lee et al. |
| 2010/0203711 A1 | 8/2010 | Wang et al. |
| 2010/0248153 A1 | 9/2010 | Lee et al. |
| 2010/0285646 A1 | 11/2010 | Lin et al. |
| 2011/0169125 A1 | 7/2011 | Reinmuth et al. |
| 2011/0223734 A1 * | 9/2011 | Davis ............ H01L 21/3065 438/296 |
| 2014/0342557 A1 | 11/2014 | Diem |

FOREIGN PATENT DOCUMENTS

| | | |
|---|---|---|
| KR | 20100111798 | 10/2010 |
| KR | 10-2011-0061910 | 6/2011 |
| TW | 101107795 | 12/2013 |
| WO | PCT/US2011/024334 | 10/2011 |
| WO | PCT/US2011/024334 | 9/2012 |
| WO | PCT/US2014/035276 | 9/2014 |

* cited by examiner

ARRAYS OF RECESSED ACCESS DEVICES, METHODS OF FORMING RECESSED ACCESS GATE CONSTRUCTIONS, AND METHODS OF FORMING ISOLATION GATE CONSTRUCTIONS IN THE FABRICATION OF RECESSED ACCESS DEVICES

TECHNICAL FIELD

Embodiments disclosed herein pertain to arrays of recessed access devices, to methods of forming recessed access gate constructions, and to methods of forming isolation gate constructions in the fabrication of recessed access devices.

BACKGROUND

Integrated circuitry may be fabricated over and within semiconductive substrates. Individual device components of the circuitry may be separated or electrically isolated from other device components by dielectric or other isolation formed over and/or within the semiconductive substrate. One form of isolation is commonly referred to as trench isolation, wherein trenches are etched into semiconductive substrate material and subsequently filled with one or more dielectric materials.

Integrated circuitry can be fabricated to have many functions, and may include many different electronic devices such as capacitors, transistors, resistors, diodes, etc. One type of circuitry is memory circuitry comprising an array of individual memory cells. In some memory circuitry, individual memory cells include a field effect transistor and a charge storage device, for example a capacitor.

One type of electronic device is a recessed access device. These devices may include a field effect transistor where the conductive transistor gate is formed within an opening within semiconductor material. A gate dielectric separates the conductive gate from the semiconductor material, and a pair of source/drain regions is formed within the semiconductor material elevationally higher than the conductive gate material. Recessed access devices may be electrically isolated relative to other devices by an isolation gate construction that may be formed deeper within the semiconductor material than the gate construction of a recessed access device.

DETAILED DESCRIPTION OF EXAMPLE EMBODIMENTS

Figure 1:
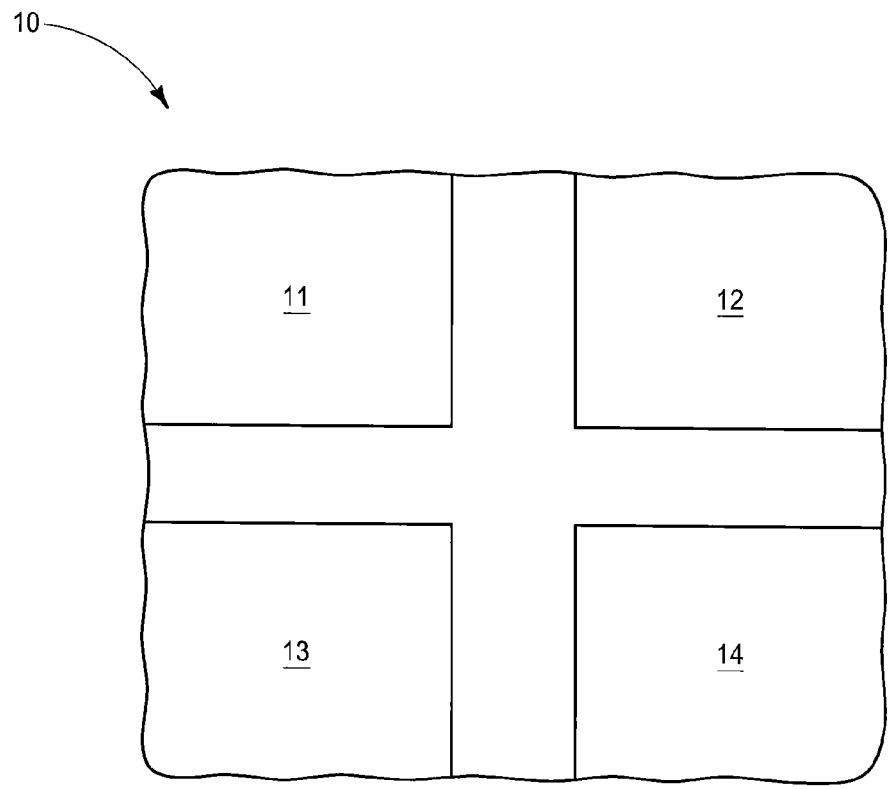
FIG. 1 is a diagrammatic top plan view of a portion substrate in process in accordance with an embodiment of the invention.

Example embodiments of methods of forming an array of recessed access device gate constructions are initially described with reference to FIGS. 1-10. Referring to FIG. 1, a substrate fragment 10 comprises a plurality of array or sub-array areas 11, 12, 13, and 14 within which recessed access device gate constructions and isolation gate constructions may be fabricated. Logic circuitry may be fabricated outside of the array areas. Control and/or other peripheral circuitry for operating the recessed access devices within the array may or may not wholly or partially be received within an array area, with an example array area as a minimum encompassing all of the recessed access devices (e.g., which may include memory cells) of a given array/sub-array. Further, multiple sub-arrays might also be fabricated and operated independently, in tandem, or otherwise relative one another. As used in the document, a "sub-array" may also be considered as an array. FIG. 1 is but one example layout, with other existing or yet-to-be-developed layouts being usable.

Figure 2:
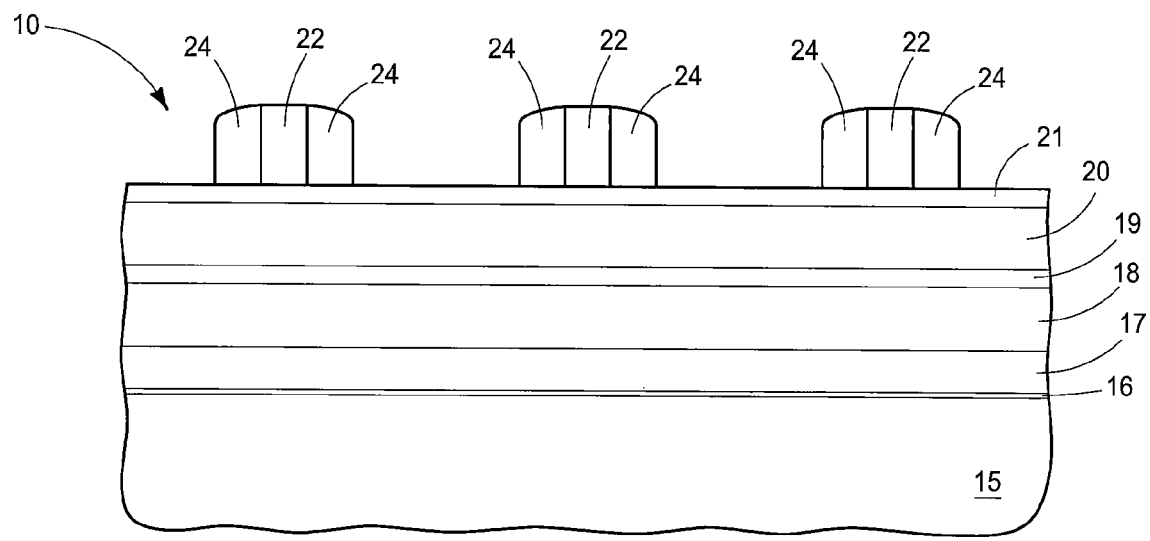
FIG. 2 is an enlarged diagrammatic sectional view of portion of the FIG. 1 substrate in process in accordance with an embodiment of the invention, and is taken through line 2-2 in FIG. 3.
Figure 3:
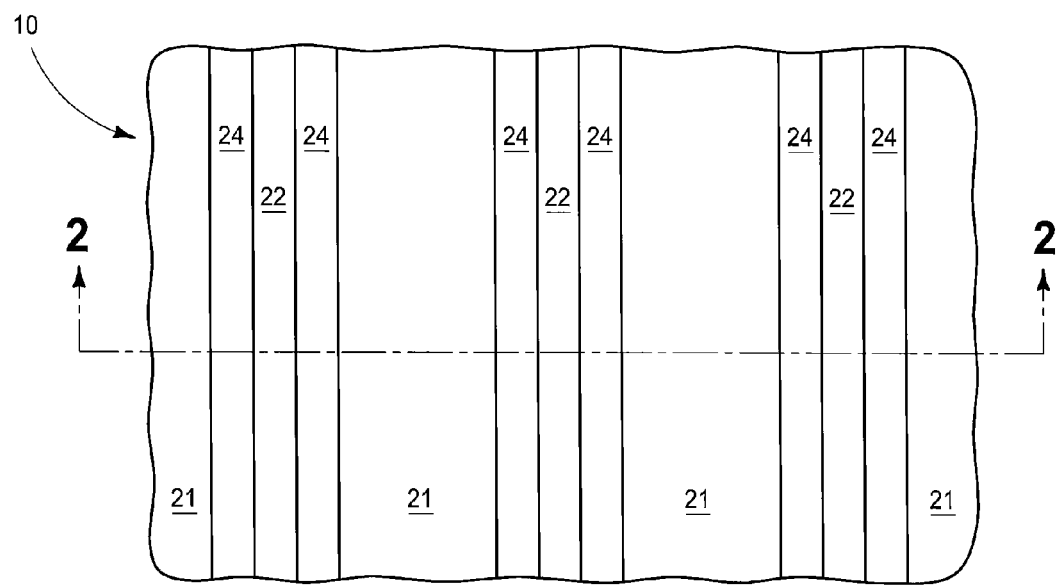
FIG. 3 is a diagrammatic top view of the FIG. 2 substrate.

Individual arrays 11, 12, 13, and 14 may include thousands or millions of recessed access devices. FIGS. 2 and 3 show a small portion of substrate 10 within one of arrays 11, 12, 13, or 14. Substrate 10 comprises a suitable base substrate 15 which may be homogenous or non-homogenous, for example comprising multiple different composition materials and/or layers. As an example, such may comprise bulk monocrystalline silicon and/or a semiconductor-on-insulator substrate. As an example, base substrate 15 may comprise semiconductor material suitably background doped with one or more conductivity modifying impurities to function as a channel region of a recessed access device and/or for formation of substrate isolation regions with isolation gate constructions.

A series of masking materials 16-21 has been formed over semiconductor material 15. Each may be homogenous or non-homogenous. An example material 16 is silicon dioxide, and an example material 17 is silicon nitride and/or polysilicon. Materials 18 and 20 may be the same or different composition hard-mask materials, and materials 19 and 21 may be the same or different composition anti-reflective coating materials. By way of example only, hard-mask materials 18 and 20 may comprise carbon, for example including any one or combination of amorphous carbon, transparent carbon, and carbon-containing polymers including spin-on-carbons (SOCs). In some embodiments, hard-mask material 20 may be considered as a first hard-mask material, and hard-mask material 18 may be considered as a second hard-mask material. Masking material and/or layers may be used in addition to materials 16-21. Further, some or all of masking materials 16-21 may not be used, and the same or different relative suitable thicknesses may be used as will be appreciated by the artisan.

Features that include patterned masking material and space there-between have been formed over material 21. In one embodiment, the features include masking blocks 22 (i.e., masses of material) having anisotropically etched sidewall spacers 24 formed thereover. Either may be homogenous or non-homogenous. As an example, material 22 may comprise photoresist and sidewall spacers may comprise silicon dioxide and/or silicon nitride. Sidewall spacers 24 may be formed by deposition of a spacer-forming material over masking blocks 22, followed by anisotropic etching of the spacer-forming material to form sidewall spacers 24. Masking blocks 22 may be formed using lithography or other technique, and may be sub-lithographic for example formed by pitch multiplication techniques. Masking blocks 22 and sidewall spacers 24 may be of the same or different maximum width(s). Masking blocks 22 and/or sidewall spacers 24 may be subjected to lateral trimming. In one example, masking blocks 22 and sidewall spacers 24 may be of the same substantial maximum width, for example a targeted width for masking block 22 being about 29 nanometers and a targeted width for sidewall spacers 24 being about 30 nanometers. Regardless, and by way of example only, a maximum width range for masking blocks 22 and sidewall spacers 24 is from about 20 nanometers to about 40 nanometers.

Figure 4:
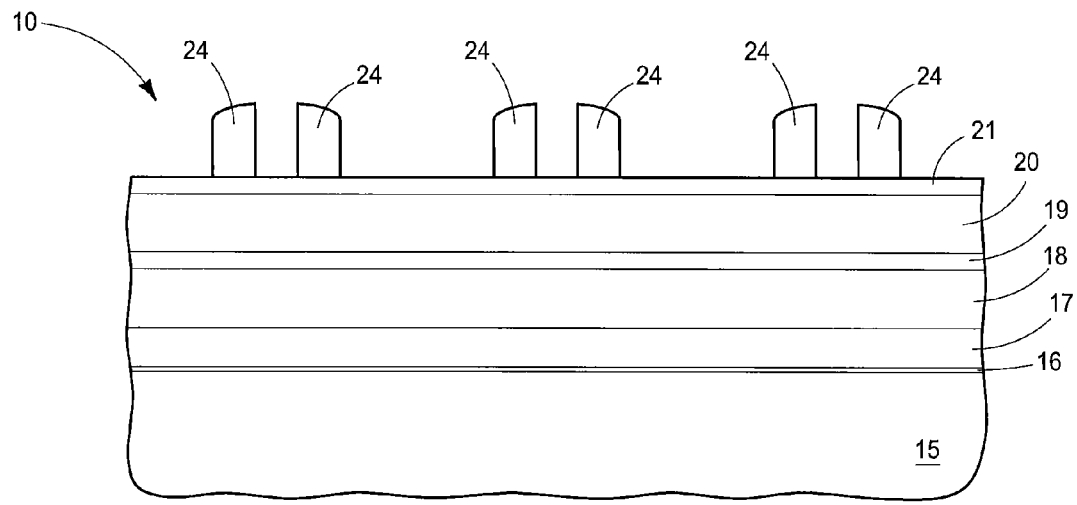
FIG. 4 is a view of the FIG. 2 substrate at a processing step subsequent to that shown in FIGS. 2 and 3.

Referring to FIG. 4, masking blocks 22 (not shown) have been removed from between sidewall spacers 24. Such may be accomplished by choosing any suitable selective etching technique which etches material 22 selectively relative to sidewall spacers 24 and to expose underlying material.

Figure 5:
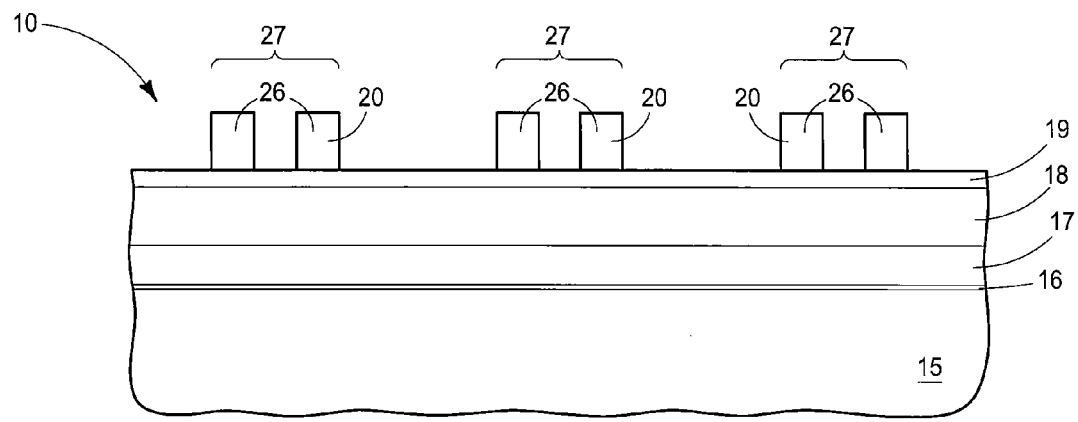
FIG. 5 is a view of the FIG. 4 substrate at a processing step subsequent to that shown in FIG. 4.

Referring to FIG. 5, sidewall spacers 24 of FIG. 4 have been used as a mask while etching through anti-reflective coating 21 and first hard-mask material 20. Sidewall spacers 24 (not shown) and anti-reflective coating material 21 (not shown) have been removed. Lateral trimming of hard-mask material 21 may or may not occur. Regardless, FIG. 5 shows formation of spaced first features 26 which in one embodiment comprise first hard-mask material 20. Further, FIGS. 2-5 show but one example embodiment of forming spaced first features 26 over semiconductor material 15. Hard-masking material 20 and anti-reflective coating material 21 might not be used if features 24 of FIG. 4 are robust enough to withstand subsequent etching in further formation of an etch mask and resulting etching into semiconductor material 15. In one embodiment, FIG. 5 shows first features 26 as comprising spaced first sets 27 of immediately adjacent first features 26. First sets 27 are shown as comprising two first features 26, although more than two first features may be included in each first set 27. In one embodiment, immediately adjacent first features 26 within individual first sets 27 are closer to one another than the spacing between immediately adjacent first sets 27.

Figure 6:
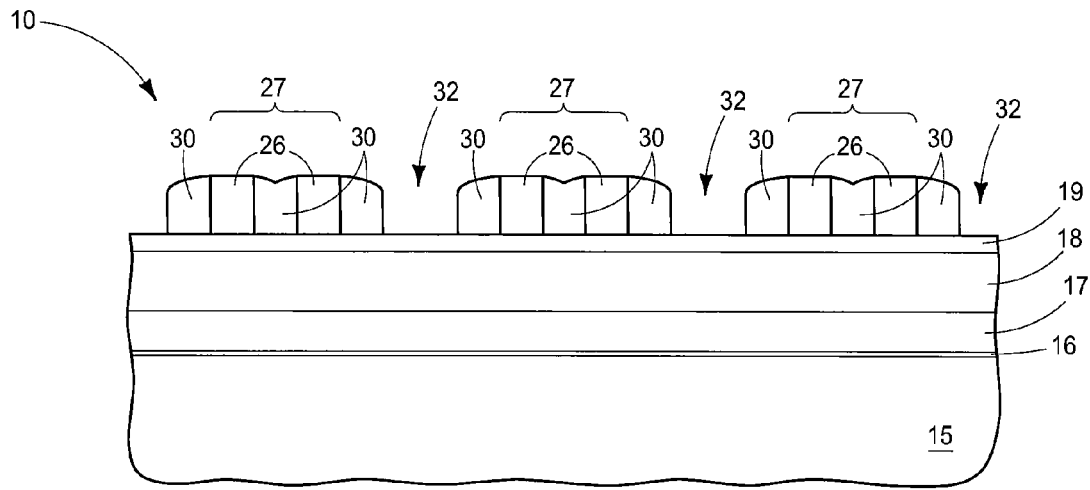
FIG. 6 is a view of the FIG. 5 substrate at a processing step subsequent to that shown in FIG. 5.

Referring to FIG. 6, masking material 30 has been formed over opposing lateral sidewalls of first features 26. Masking material 30 spans completely between immediately adjacent first features 26 within first sets 27 but does not span completely between immediately adjacent first sets 27, for example leaving a space 32 between immediately adjacent first sets 27. Masking material 30 may be formed by depositing a spacer-forming material (which may be of the same or different composition from that used in forming spacers 24) over substrate 15, followed by anisotropic etching to form the structure of FIG. 6. Masking material 30 may be homogenous or non-homogenous, and lateral trimming thereof may or may not occur.

Figure 7:
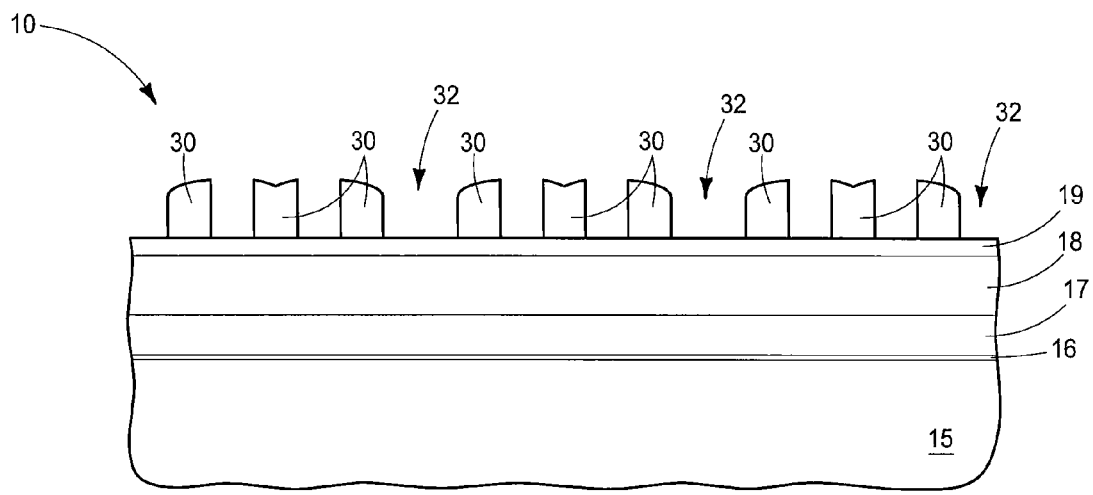
FIG. 7 is a view of the FIG. 6 substrate at a processing step subsequent to that shown in FIG. 6.

Referring to FIG. 7, first features 26 (not shown) have been removed from between masking material 30. Masking material 30 may or may not be subsequently trimmed.

Figure 8:
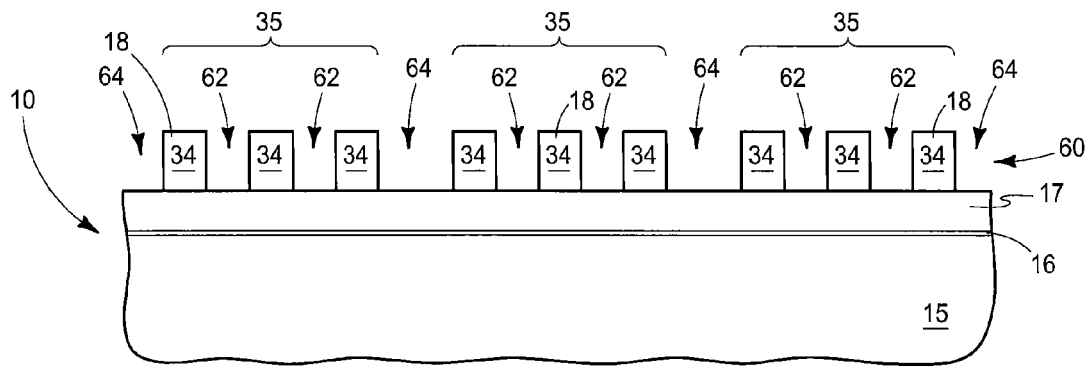
FIG. 8 is a view of the FIG. 7 substrate at a processing step subsequent to that shown in FIG. 7.

Referring to FIG. 8, features 30 of FIG. 7 have been used as a mask while etching through anti-reflective coating 19 and second hard-mask material 18. Anti-reflective coating 19 (not shown) and features 30 (not shown) have been removed. Lateral trimming of second hard-mask material 18 may or may not occur. Regardless, FIG. 8 shows formation of spaced second features 34 which in one embodiment comprise second hard-mask material 18. In one embodiment, FIG. 8 shows second features 34 as comprising spaced second sets 35 of immediately adjacent second features 34. In one embodiment, immediately adjacent second features 34 within individual second sets 35 are closer to one another than spacing between immediately adjacent second sets 35. As an example, a targeted spacing between immediately adjacent second features 34 within a second set 35 is about 30 nanometers, while a targeted spacing between immediately adjacent sets 35 is from about 35 to 45 nanometers.

In one embodiment, and referring to FIGS. 5 and 8 as an example, first features 26 comprise masking blocks and second features 34 comprise masking blocks. Such may or may not be of the same dimensions relative one another. In one embodiment, the number of first feature masking blocks in each of the first sets is the same and the number of second feature masking blocks in each of the second sets is the same, with the number of second feature masking blocks in the second set being one greater than the number of first features masking blocks in the first sets. As an example and as shown in FIGS. 5 and 8, the number of second feature masking blocks 34 in second sets 35 is three and the number of first feature masking blocks 26 in first sets 27 is two.

Figure 9:
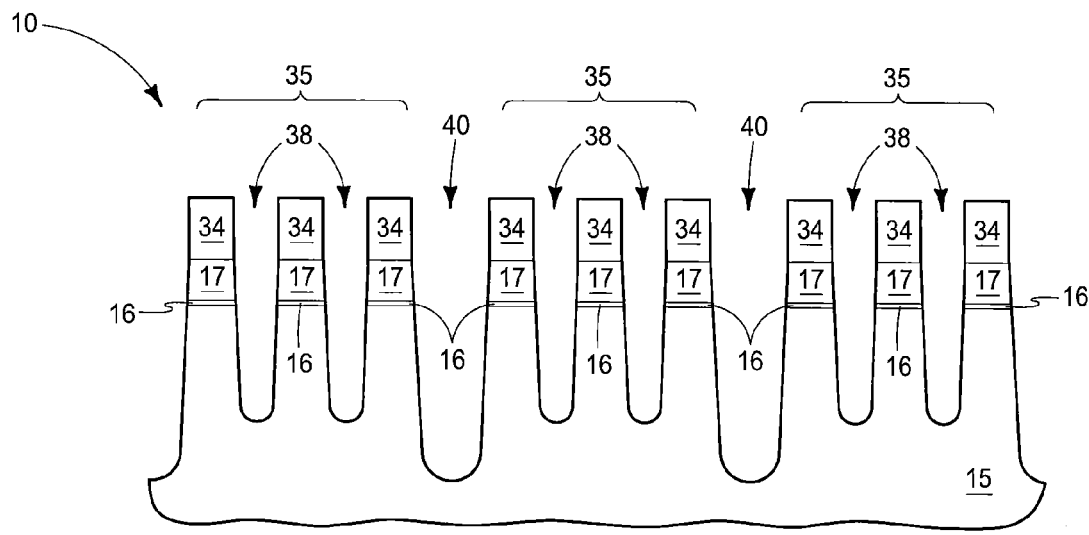
FIG. 9 is a view of the FIG. 8 substrate at a processing step subsequent to that shown in FIG. 8.

Referring to FIG. 9, isolation trenches 40 and recessed access device trenches 38 have been simultaneously etched into semiconductor material 15 using second sets 35 as a mask. Specifically, recessed access device trenches 38 have been formed through mask openings 62 (FIG. 8) between immediately adjacent second features 34 within second sets 35. Isolation trenches 40 have been formed through mask openings 64 (FIG. 8) between immediately adjacent second sets 35, and are formed deeper into semiconductor material 15 than are recessed access device trenches 38 (i.e., due to mask openings 64 between second sets 35 being wider than mask openings 62 between immediately adjacent second features 34 within an individual set 35). An example etching chemistry where the material of second features 34 is carbon and semiconductor material 15 is monocrystalline silicon, includes chlorine based and/or hydrogen bromide based chemistries. The same or different example chemistry may be used for etching through one or more of masking materials 17 and 16 where such are present.

In one embodiment, the simultaneously etching forms all of the recessed access device trenches that are ever formed within all of the array. In one embodiment, the simultaneously etching forms all of the isolation trenches that are ever formed within all of the array.

Figure 10:
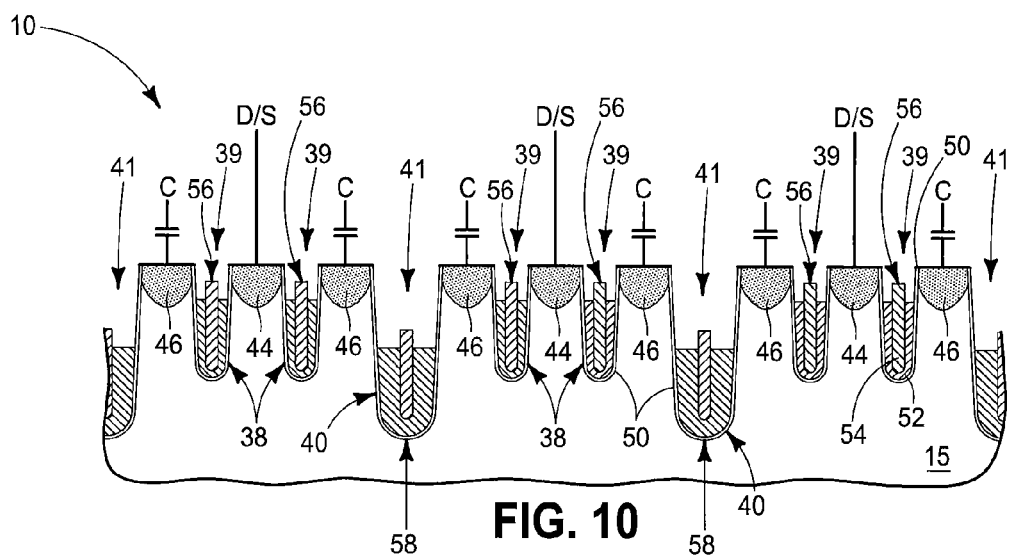
FIG. 10 is a view of the FIG. 9 substrate at a processing step subsequent to that shown in FIG. 9.

Referring to FIG. 10, individual isolation gate constructions 41 have been formed in individual isolation trenches 40 and individual recessed access gate constructions 39 have been formed in individual recessed access device trenches 38. Second features 34 (not shown) and masking materials 16 and 17 (not shown) have been removed. Source/drain regions 44 have been formed between recessed access device constructions 39. Source/drain regions 46 have been formed between isolation gate constructions 41 and access device gate constructions 39. Source/drain regions 44, 46 may be formed by ion implanting and subsequent thermal activation. Data/sense lines DS may electrically couple to source/drain regions 44, and capacitors C may couple to source/drain regions 46.

Isolation gate constructions 41 and recessed access device gate constructions 39 may comprise the same materials and may be formed simultaneously. In one embodiment, the isolation and/or recessed access device gate constructions individually comprise a first conductive gate material received within and projecting elevationally outward of a second conductive gate material, where the first and second conductive gate materials are of different compositions. As an example and as shown, trenches 38 and 40 have been lined with a suitable gate dielectric 50 followed by lining with a first conductor material 52 and filling remaining volume of the trenches with a second conductor material 54. An example first conductor material is titanium nitride, and an example second conductor material is elemental tungsten. Conductor materials 52 and 54 have been recessed back within trenches 38 and 40 by an etching process which etches the example titanium nitride 52 slightly faster than the tungsten 54, resulting in tungsten 54 projecting outwardly relative to titanium nitride 52 within trenches 38 and 40. Alternate constructions within trenches 38 and 40 may of course be used. Regardless, in one embodiment the recessed access device gate constructions may be considered as individually comprising a conductive gate having an elevationally outermost conductive surface 56. Surfaces 56 may or may not be planar. Regardless, the conductive portion of the recessed access gates will have some elevationally outermost extent that defines an outermost surface. It may be desirable to have all of elevationally outermost conductive surfaces 56 of recessed access gate constructions 39 at the same elevation within/relative to semiconductor material 15.

In one embodiment, isolation gate constructions 41 may be considered as comprising an elevationally innermost surface 58, which in one embodiment may be dielectric. Further, it may be desirable to have all of elevationally innermost surfaces 58 of isolation gate constructions 41 at the same elevation within/relative to semiconductor material 15 (albeit, different from and lower than the elevation of outermost surfaces 56 of gate constructions 39).

Figure 11:
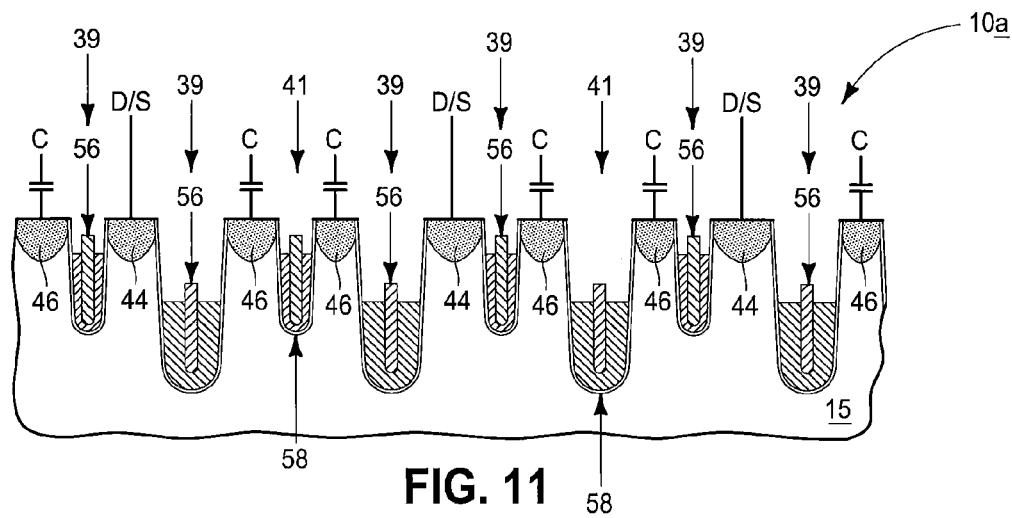
FIG. 11 is a diagrammatic sectional view of a predecessor substrate.

FIG. 11 shows a predecessor substrate 10*a* to that of substrate 10 of FIG. 10. Like numerals from the FIG. 10 embodiment have been used with respect to substrate 10*a*. The construction of FIG. 11, compared to that of FIG. 10, has significant elevational variation in the position of outermost conductive surfaces 56 of recessed access device gate constructions 39 relative to depth within semiconductor material 15. Individual predecessor substrates exemplified by FIG. 11 have elevational differences of different conductive surfaces 56 of gates 39 throughout the array that are greater than or equal to 175 Angstroms of an elevational thickness of semiconductor material 15. Some different conductive surfaces 56 of gates 39 of individual predecessor substrates within all of a given array are elevationally within less than 50 Angstroms of elevational thickness of semiconductor material 15. Nevertheless, numerous different conductive surfaces 56 of recessed access device gate constructions 39 in the individual predecessor substrates within a given array are elevationally at least 175 Angstroms apart with respect to elevational thickness of semiconductor material 15.

In accordance with one embodiment of the invention, the elevationally outermost conductive surfaces 56 of all recessed access gate constructions 39 within all of the array relative one another are within no greater than 50 Angstroms of elevational thickness of semiconductor material 15. In one embodiment, such outermost conductive surfaces 56 are within no greater than 25 Angstroms, and in one embodiment within no greater than 10 Angstroms, of elevational thickness of semiconductor material 15.

Further, the construction of FIG. 11 compared to that of FIG. 10 has significant elevational variation in the position of innermost surfaces 58 of isolation gate constructions 41 relative to depth within semiconductor material 15. Individual predecessor substrates exemplified by FIG. 11 have elevational differences of different innermost surfaces 58 of gates 41 throughout the array that are greater than or equal to 150 Angstroms of an elevational thickness of semiconductor material 15. Some different innermost surfaces 58 of gates 41 of individual predecessor substrates within all of a given array are elevationally within less than 10 Angstroms of elevational thickness of semiconductor material 15. Nevertheless, numerous different innermost surfaces 58 of isolation gate constructions 41 in the individual predecessor substrates within a given array are elevationally at least 150 Angstroms apart with respect to elevational thickness of semiconductor material 15.

In accordance with one embodiment of the invention, the elevationally innermost surfaces 58 of all isolation gate constructions 41 within all of the array relative one another are within no greater than 40 Angstroms of elevational thickness of semiconductor material 15. In one embodiment, such innermost surfaces 58 are within no greater than 20 Angstroms, and in one embodiment within no greater than 10 Angstroms, of elevational thickness of semiconductor material 15.

One reason large differences in elevations may occur with respect to the elevationally outermost conductive surfaces of the recessed access devices and with respect to the elevationally innermost surfaces of the isolation gates may be due to use of an etch mask used in forming the various trenches within semiconductor material 15. Specifically, the predecessor processing uses the lateral dimensions of laterally trimmed photoresist blocks as well as space between anisotropically etched sidewall spacers for forming a combination of the isolation trenches and recessed access device trenches. Such may not occur in some embodiments of the invention. Further, more precise width dimensions of masking blocks and spaces there-between may be achieved where no lateral trimming of any masking blocks occurs. No lateral trimming of any masking block may occur in embodiments of the invention. Less ideal, in some embodiments of the invention lateral trimming of some or all masking blocks may occur in some or all steps.

An embodiment of the invention encompasses a method of forming an array of recessed access device gate constructions independent of whether isolation gate constructions are formed. Such comprises using the width of an anisotropically etched sidewall spacer (i.e., formed from a sidewall spacer-forming material) in forming mask openings in an etch mask for forming all recessed access device trenches within semiconductor material within all of the array. As one example, FIG. 8 shows such an example etch mask 60 having such mask openings 62. In one embodiment, mask openings 62 have resulted by use of the width of an anisotropically etched sidewall spacer that was used to form sidewall spacers 24 in FIG. 2. The width of such spacer-forming material was transferred in forming spaced first features 26 in FIG. 5, which were then ultimately removed and used to form spaced features 34 in FIG. 8 and mask openings 62. Accordingly, it was width of spacer-forming material 24 in FIG. 2 that ultimately was used in forming mask openings 62 in mask 60. The etch mask is used while etching all of the recessed access device trenches into the semiconductor material within all of the array through the mask openings. For example, FIGS. 8 and 9 show one such example etching of all of recessed access device trenches 38 that are to be formed within semiconductor material 15 within all of the array through mask openings 62. Individual recessed access gate constructions, for example constructions 39, are ultimately formed in individual recessed access device trenches 39.

In one embodiment, space between anisotropically etched sidewall spacers is used in forming second mask openings in the etch mask for forming isolation trenches within the semiconductor material within the array. As an example, space 32 between anisotropically etched sidewall spacers 30 in FIG. 6 have been used for forming second mask openings 64 in etch mask 60 in FIG. 8 which are used for forming isolation trenches 40 within semiconductor material 15 within the array. Individual isolation gate constructions 41 are ultimately formed in individual isolation trenches 40, for example as shown in FIG. 10.

In one embodiment, the sidewall spacers are formed using a different sidewall spacer-forming material than was used in forming the first mask openings. For example, sidewall spacers 30 used for forming the openings in FIG. 7 is different than the sidewall spacer-forming material used to form sidewall spacers 24 which are ultimately used to form first mask openings 62. Such different sidewall spacer-forming materials, however, may be of the same composition. In one embodiment, the etch mask is formed in hard-mask material underlying the anisotropically etched sidewall spacers. For example, FIG. 8 shows etch mask 60 formed from the anisotropically etched spacers of FIG. 7.

In one embodiment and as shown, space 32 between anisotropically etched sidewall spacers 30 has been used in forming second mask openings 64 in etch mask 60 for forming all isolation trenches within semiconductor material 15 within all of the array.

An embodiment of the invention encompasses a method of forming an array of isolation gate constructions in the fabrication of recessed access devices independent of how or when those recessed access devices are fabricated. Such a method comprises using space between anisotropically etched sidewall spacers in forming mask openings in an etch mask for forming all isolation trenches within the semiconductor material within all of the array. The etch mask is used while etching all of the isolation trenches into the semiconductor material within all of the array through the mask openings. Individual isolation gate constructions are formed in the individual isolation trenches. Additional or other attributes as described above may be used.

An embodiment of the invention includes a method of forming an array of recessed access device gate constructions and isolation gate constructions. Such a method comprises forming an initial feature pattern in a first hard-mask. The initial feature pattern comprises blocks (i.e., masses of material) for forming recessed access device trenches within semiconductor material within the array. FIG. 5 shows one example initial feature pattern. Spacer material is formed over sidewalls of the blocks, and the blocks are removed from between the spacer material. A subsequent feature pattern is thereby formed which comprises first mask openings for forming the recessed access device trenches within semiconductor material within the array. The subsequent feature pattern comprises second mask openings for forming isolation trenches within the semiconductor material within the array. FIG. 7 shows such an example subsequent feature pattern.

The subsequent feature pattern is transferred to a second hard-mask overlying the semiconductor material. FIG. 8 shows such example processing. The second hard-mask which comprises the transferred feature pattern is used in simultaneously etching the recessed access device trenches and the isolation trenches into the semiconductor material within the array. FIG. 9 shows example such processing. Individual isolation gate constructions are formed in individual isolation trenches and individual recessed access gate constructions are formed in individual recessed access device trenches, for example as shown in FIG. 10. Additional or other attributes as described above may be used.

Embodiments of the invention encompass arrays of recessed access devices independent of the method of manufacture. In one embodiment, such an array comprises a plurality of isolation gate constructions within isolation trenches formed in semiconductor material. At least two recessed access device gate constructions are individually within individual gate trenches formed in the semiconductor material between immediately adjacent the isolation gate constructions. Source/drain regions are between the recessed access device gate constructions and between the isolation gate constructions and the recessed access device gate constructions. The recessed access device gate constructions individually comprise a conductive gate having an elevationally outermost surface. The elevationally outermost conductive surfaces of all of the recessed access device gate constructions within all of the array relative one another are within no greater than 50 Angstroms of elevational thickness of the semiconductor material. FIG. 10 shows a portion of such an example array, and independent of whether elevationally innermost surfaces 58 of isolation gate constructions 41 are within no greater than 40 Angstroms of elevational thickness of semiconductor material 15.

In one embodiment, the elevationally outermost conductive surfaces of all of the recessed access device gate constructions within all of the array relative one another are within no greater than 25 Angstroms, and in one embodiment within no greater than 10 Angstroms, of elevational thickness of the semiconductor material. In one embodiment, the conductive gates individually comprise a first conductive gate material received within and projecting elevationally outward of a second conductive gate material. The first and second conductive gate materials are of different compositions, and the elevationally outermost surface is of the first conductive gate material. Again, FIG. 10 discloses such an example embodiment. Additional or other attributes as described above may be used.

In one embodiment, an array of recessed access devices includes a plurality of isolation gate constructions within isolation trenches formed in semiconductor material. At least two recessed access device gate constructions are individually within individual gate trenches formed in the semiconductor material between immediately adjacent the isolation gate constructions. Source/drain regions are between the recessed access device gate constructions and between the isolation gate constructions and the recessed access device gate constructions. The isolation gate constructions individually comprise an elevationally innermost surface. The elevationally innermost surfaces of all of the isolation gate constructions within all of the array relative one another are within no greater than 40 Angstroms of elevational thickness of the semiconductor material independent of the elevational positioning of the outermost conductive surfaces of the recessed access device gates.

In one embodiment, the elevationally innermost surfaces of all of the isolation gate constructions within all of the array relative one another are within no greater than 20 Angstroms, and in one embodiment within no greater than 10 Angstroms, of elevational thickness of the semiconductor material. Additional or other attributes as described above may be used.

Recessed access devices as disclosed herein may include additional components. For example and by way of example only, such might comprise individual memory cells of DRAM or other memory. By way of example, FIG. 10 shows example connection of source/drain regions 44 with different data/sense lines D/S. Source/drain regions 46 are shown connected with different charge storage devices, with capacitors C being shown as but one example charge storage device.

DRAM or other memory that doesn't use separate charge storage device constructions may be used.

CONCLUSION

In some embodiments, a method of forming an array of recessed access device gate constructions includes using the width of an anisotropically etched sidewall spacer in forming mask openings in an etch mask for forming all recessed access device trenches within semiconductor material within all of the array. The etch mask is then used while etching all of the recessed access device trenches into the semiconductor material within all of the array through the mask openings. Individual recessed access gate constructions are formed in the individual recessed access device trenches.

In some embodiments, a method of forming an array of isolation gate constructions in the fabrication of recessed access devices includes using space between anisotropically etched sidewall spacers in forming mask openings in an etch mask for forming all isolation trenches within the semiconductor material within all of the array. The etch mask is then used while etching all of the isolation trenches into the semiconductor material within all of the array through the mask openings. Individual isolation gate constructions are formed in the individual isolation trenches.

In some embodiments, a method of forming an array of recessed access device gate constructions and isolation gate constructions includes using the width of an anisotropically etched sidewall spacer in forming first mask openings in an etch mask for forming all recessed access device trenches within semiconductor material within all of the array. Space between anisotropically etched sidewall spacers is used in forming second mask openings in the etch mask for forming isolation trenches within the semiconductor material within the array. Then the etch mask is used while simultaneously etching the isolation trenches into the semiconductor material within the array through the second mask openings and all of the recessed access device trenches into the semiconductor material within all of the array through the first mask openings. The isolation trenches are formed deeper into the semiconductor material than are the recessed access device trenches. Individual isolation gate constructions are formed in the individual isolation trenches and individual recessed access gate constructions are formed in the individual recessed access device trenches.

In some embodiments, a method of forming an array of recessed access device gate constructions and isolation gate constructions includes using the width of an anisotropically etched sidewall spacer in forming mask openings in an etch mask for forming recessed access device trenches within semiconductor material within the array. Space between anisotropically etched sidewall spacers is used in forming second mask openings in the etch mask for forming all isolation trenches within the semiconductor material within all of the array. Then the etch mask is used while simultaneously etching the recessed access device trenches into the semiconductor material within the array through the first mask openings and all of the isolation trenches into the semiconductor material within all of the array through the second mask openings. The isolation trenches are formed deeper into the semiconductor material than are the recessed access device trenches. Individual isolation gate constructions are formed in the individual isolation trenches and individual recessed access gate constructions are formed in the individual recessed access device trenches.

In some embodiments, a method of forming an array of recessed access device gate constructions and isolation gate constructions includes forming spaced first features over semiconductor material. The first features comprise spaced first sets of immediately adjacent first features. Immediately adjacent first features within individual first sets are closer to one another than spacing between immediately adjacent first sets. Masking material is formed over opposing lateral sidewalls of the first features. The masking material spans completely between immediately adjacent first features within the first sets. The masking material does not span completely between immediately adjacent first sets. The first features are removed from between the masking material and spaced second features are formed. The second features comprise spaced second sets of immediately adjacent second features. Immediately adjacent second features within individual second sets are closer to one another than spacing between immediately adjacent second sets. Isolation trenches and recessed access device trenches are simultaneously etched into the semiconductor material using the second sets as a mask. The recessed access device trenches are formed through mask openings between immediately adjacent second features within the second sets. The isolation trenches are formed through mask openings between the second sets and are formed deeper into the semiconductor material than are the recessed access device trenches. Individual isolation gate constructions are formed in the individual isolation trenches and individual recessed access gate constructions are formed in the individual recessed access device trenches.

In some embodiments, a method of forming an array of recessed access device gate constructions and isolation gate constructions includes forming an initial feature pattern in a first hard-mask. The initial feature pattern comprises blocks (i.e., masses of material) for forming recessed access device trenches within semiconductor material within the array. Spacer material is formed over sidewalls of the blocks. The blocks are removed from between the spacer material to form a subsequent feature pattern comprising first mask openings for forming the recessed access device trenches within semiconductor material within the array and comprising second mask openings for forming isolation trenches within the semiconductor material within the array. The subsequent feature pattern is transferred to a second hard-mask overlying the semiconductor material. The second hard-mask comprising the transferred feature pattern is used in simultaneously etching the recessed access device trenches and the isolation trenches into the semiconductor material within the array. Individual isolation gate constructions are formed in the individual isolation trenches and individual recessed access gate constructions are formed in the individual recessed access device trenches.

In some embodiments, an array of recessed access devices comprises a plurality of isolation gate constructions within isolation trenches formed in semiconductor material. At least two recessed access device gate constructions are individually within individual gate trenches formed in the semiconductor material between immediately adjacent the isolation gate constructions. Source/drain regions are between the recessed access device gate constructions and between the isolation gate constructions and the recessed access device gate constructions. The recessed access device gate constructions individually comprise a conductive gate having an elevationally outermost conductive surface. The elevationally outermost conductive surfaces of all of the recessed access device gate constructions within all of the array relative one another are within no greater than 50 Angstroms of elevational thickness of the semiconductor material.

In some embodiments, an array of recessed access devices comprises a plurality of isolation gate constructions within isolation trenches formed in semiconductor material. At least two recessed access device gate constructions are individually within individual gate trenches formed in the semiconductor material between immediately adjacent the isolation gate constructions. Source/drain regions are between the recessed access device gate constructions and between the isolation gate constructions and the recessed access device gate constructions. The isolation gate constructions individually comprise an elevationally innermost surface. The elevationally innermost surfaces of all of the isolation gate constructions within all of the array relative one another are within no greater than 40 Angstroms of elevational thickness of the semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an array of recessed access device gate constructions, comprising:
using width of anisotropically etched sidewall spacers in forming mask openings in an etch mask for forming all recessed access device trenches within semiconductor material within all of the array, the forming of the mask openings in the etch mask comprising removing the spacers and forming said mask openings in the etch mask elevationally inward of locations where the spacers were;
using the etch mask while etching all of the recessed access device trenches into the semiconductor material within all of the array through the mask openings; and
forming individual recessed access gate constructions in the individual recessed access device trenches.

2. A method of forming an array of recessed access device gate constructions, comprising:
using the width of anisotropically etched sidewall spacers in forming mask openings in an etch mask for forming all recessed access device trenches within semiconductor material within all of the array;
using the etch mask while etching all of the recessed access device trenches into the semiconductor material within all of the array through the mask openings; and
forming individual recessed access gate constructions in the individual recessed access device trenches, the recessed access device gate constructions individually comprising a conductive gate having an elevationally outermost conductive surface, the elevationally outermost conductive surfaces of all of the conductive gates of the recessed access device gate constructions within all of the array relative one another being within no greater than 50 Angstroms of elevational thickness of the semiconductor material.

3. The method of claim 1 comprising forming individual isolation gate constructions in individual isolation trenches formed in the semiconductor material.

4. A method of forming an array of recessed access device gate constructions and isolation gate constructions, comprising:
using width of anisotropically etched sidewall spacers in forming first mask openings in an etch mask for forming all recessed access device trenches within semiconductor material within all of the array;
using space between anisotropically etched sidewall spacers in forming second mask openings in the etch mask for forming isolation trenches within the semiconductor material within the array;
using the etch mask while simultaneously etching the isolation trenches into the semiconductor material within the array through the second mask openings and all of the recessed access device trenches into the semiconductor material within all of the array through the first mask openings, the isolation trenches being formed deeper into the semiconductor material than are the recessed access device trenches; and
forming individual isolation gate constructions in the individual isolation trenches and individual recessed access gate constructions in the individual recessed access device trenches.

5. The method of claim 4 comprising using anisotropically etched sidewall spacer material in forming a hard-mask having features over which the anisotropically etched sidewall spacers are formed.

6. The method of claim 4 comprising forming the etch mask in hard-mask material underlying the anisotropically etched sidewall spacers.

7. A method of forming an array of isolation gate constructions and recessed access device gate constructions, comprising:
using space between anisotropically etched sidewall spacers in forming mask openings in an etch mask for forming all isolation trenches that are ever formed within semiconductor material within all of the array and for forming recessed access device trenches;
using the etch mask while simultaneously etching all of the isolation trenches that are ever formed into the semiconductor material within all of the array through the mask openings and while etching the recessed access device trenches; and
forming individual isolation gate constructions in the individual isolation trenches and individual recessed access gate constructions in the individual recessed access device trenches, the isolation gate constructions and the recessed access device gate constructions each being formed to comprise conductive material.

8. A method of forming an array of isolation gate constructions and recessed access device gate constructions, comprising:
using space between anisotropically etched sidewall spacers in forming mask openings in an etch mask for forming all isolation trenches within the semiconductor material within all of the array and for forming recessed access device trenches;
using the etch mask while etching all of the isolation trenches into the semiconductor material within all of the array through the mask openings and while etching the recessed access device trenches; and
forming individual isolation gate constructions in the individual isolation trenches and individual recessed access gate constructions in the individual recessed access device trenches, the isolation gate constructions and the recessed access device gate constructions each being formed to comprise conductive material, the conductive material of the isolation gate constructions individually comprising an elevationally innermost surface, the elevationally innermost surfaces of all of the conductive material of the isolation gate constructions within all of the array relative one another being within no greater than 40 Angstroms of elevational thickness of the semiconductor material.

9. A method of forming an array of recessed access device gate constructions and isolation gate constructions, comprising:
- using width of anisotropically etched sidewall spacers in forming first mask openings in an etch mask for forming recessed access device trenches within semiconductor material within the array;
- using space between anisotropically etched sidewall spacers in forming second mask openings in the etch mask for forming all isolation trenches within the semiconductor material within all of the array;
- using the etch mask while simultaneously etching the recessed access device trenches into the semiconductor material within the array through the first mask openings and all of the isolation trenches into the semiconductor material within all of the array through the second mask openings; the isolation trenches being formed deeper into the semiconductor material than are the recessed access device trenches; and
- forming individual isolation gate constructions in the individual isolation trenches and individual recessed access gate constructions in the individual recessed access device trenches.

10. The method of claim 9 wherein the simultaneously etching forms all of the recessed access device trenches that are within all of the array.

11. A method of forming an array of recessed access device gate constructions and isolation gate constructions, comprising:
- forming spaced first features over semiconductor material, the first features comprising spaced first sets of immediately adjacent first features, the immediately adjacent first features within individual first sets being closer to one another than spacing between immediately adjacent first sets;
- forming masking material over opposing lateral sidewalls of the first features, the masking material spanning completely between immediately adjacent first features within the first sets, the masking material not spanning completely between immediately adjacent first sets;
- removing the first features from between the masking material and forming spaced second features, the second features being different from the first features, the second features comprising spaced second sets of immediately adjacent second features, the immediately adjacent second features within individual second sets being closer to one another than spacing between immediately adjacent second sets;
- simultaneously etching isolation trenches and recessed access device trenches into the semiconductor material using the second sets as a mask, the recessed access device trenches being formed through mask openings between immediately adjacent second features within the second sets, the isolation trenches being formed through mask openings between the second sets and being formed deeper into the semiconductor material than are the recessed access device trenches; and
- forming individual isolation gate constructions in the individual isolation trenches and individual recessed access gate constructions in the individual recessed access device trenches.

12. The method of claim 11 wherein the first features comprise masking blocks and the second features comprise masking blocks, the number of first feature masking blocks in each of the first sets is the same and the number of second feature masking blocks in each of the second sets is the same, the number of second feature masking blocks in the second sets being one greater than the number of first feature masking blocks in the first sets.

13. The method of claim 12 wherein the number of second feature masking blocks in the second sets is 3 and the number of first feature masking blocks in the first set is 2.

14. The method of claim 11 wherein forming the spaced first features comprises:
- forming anisotropically etched sidewall spacers over masking blocks received over a hard-mask material;
- removing the masking blocks from between the sidewall spacers; and
- etching into the hard-mask material using the sidewall spacers as a mask and forming the spaced first features from the hard-mask material.

15. The method of claim 11 wherein forming the spaced second features comprises etching into a hard-mask material underlying the masking material and forming the spaced second features from the hard-mask material.

16. The method of claim 11 wherein,
forming the spaced first features comprises:
- forming anisotropically etched sidewall spacers over masking blocks received over a first hard-mask material;
- removing the masking blocks from between the sidewall spacers; and
- etching into the first hard-mask material using the sidewall spacers as a mask and forming the spaced first features from the first hard-mask material; and forming the spaced second features comprises:
- etching into a second hard-mask material underlying the masking material and forming the spaced second features from the second hard-mask material.

17. A method of forming an array of recessed access device gate constructions and isolation gate constructions, comprising:
- forming an initial feature pattern in a first hard-mask, the initial feature pattern comprising blocks for forming recessed access device trenches within semiconductor material within the array;
- forming spacer material over sidewalls of the blocks;
- removing the blocks from between the spacer material to form a subsequent feature pattern comprising first mask openings for forming the recessed access device trenches within semiconductor material within the array and comprising second mask openings for forming isolation trenches within the semiconductor material within the array;
- transferring the subsequent feature pattern to a second hard-mask overlying the semiconductor material;
- using the second hard-mask comprising the transferred feature pattern in simultaneously etching the recessed access device trenches and the isolation trenches into the semiconductor material within the array; and
- forming individual isolation gate constructions in the individual isolation trenches and individual recessed access gate constructions in the individual recessed access device trenches.

18. The method of claim 17 wherein the simultaneously etching forms all of the recessed access device trenches that are within all of the array.

19. The method of claim 17 wherein the simultaneously etching forms all of the isolation trenches that are within all of the array.

20. The method of claim 17 wherein,
the simultaneously etching forms all of the recessed access device trenches that are within all of the array; and the simultaneously etching forms all of the isolation trenches that are within all of the array.

21. The method of claim 17 wherein the isolation trenches are formed deeper into the semiconductor material than are the recessed access device trenches.

22. The method of claim 2 wherein the forming of the mask openings in the etch mask comprises removing the spacers and forming said mask openings in the etch mask elevationally inward of locations where the spacers were.

23. The method of claim 8 wherein using the etch mask comprises simultaneously etching all of the isolation trenches that are ever formed into the semiconductor material within all of the array through the mask openings.

24. The method of claim 7 wherein the isolation trenches extend deeper into the semiconductor material than do the recessed access device gate trenches.

25. The method of claim 7 wherein the conductive material of the individual isolation gate constructions comprises a first conductive material and a second conductive material, the first and second conductive materials being of different compositions relative one another, the first conductive material being within the individual isolation trenches that are within the semiconductive material, the second conductive material being within the individual isolation trenches that are within the semiconductive material.

26. The method of claim 25 wherein the first conductive material extends elevationally deeper within the individual isolation trenches than does the second conductive material.

27. The method of claim 26 comprising forming the first conductive material within the individual isolation trenches before forming the second conductive material within the individual trenches.

28. The method of claim 25 wherein the second conductive material extends elevationally higher within the individual isolation trenches than does the first conductive material.

29. The method of claim 28 comprising forming the first conductive material within the individual isolation trenches before forming the second conductive material within the individual isolation trenches.

30. The method of claim 26 wherein the second conductive material extends elevationally higher within the individual isolation trenches than does the first conductive material.

31. The method of claim 30 comprising forming the first conductive material within the individual isolation trenches before forming the second conductive material within the individual isolation trenches.

32. The method of claim 25 comprising forming the first conductive material to line sidewalls of the individual isolation trenches, and forming the second conductive material within the individual isolation trenches laterally between the first conductive material that lines the sidewalls of the individual isolation trenches.

33. The method of claim 32 wherein the second conductive material extends elevationally higher within the individual isolation trenches than does the first conductive material.

34. The method of claim 32 comprising forming the first conductive material to line a base of the individual isolation trenches.

35. The method of claim 34 wherein the second conductive material extends elevationally higher within the individual isolation trenches than does the first conductive material.

36. The method of claim 25 comprising:
   forming the first conductive material to line sidewalls and a base of the individual isolation trenches, and forming the second conductive material within the individual isolation trenches laterally between the first conductive material that lines the sidewalls of the individual isolation trenches and elevationally over first conductive material that lines the bases of the individual isolation trenches; and
   etching the first conductive material and the second conductive material that are each within the individual isolation trenches to recess the first and second conductive materials within the individual isolation trenches, the first conductive material being etched faster than the second conductive material to recess the first conductive material to a greater degree within the individual isolation trenches than the second conductive material is recessed within the individual isolations trenches.

37. The method of claim 7 comprising forming a charge storage device electrically coupled to a source/drain region on each immediately-adjacent lateral side of the individual isolation gate constructions.

38. The method of claim 7 comprising forming two of the individual recessed access gate constructions between immediately laterally adjacent of the individual isolation gate constructions.

* * * * *